United States Patent
Kuan et al.

(10) Patent No.: US 8,984,250 B2
(45) Date of Patent: Mar. 17, 2015

(54) MEMORY CONTROLLER, MEMORY DEVICE AND METHOD FOR DETERMINING TYPE OF MEMORY DEVICE

(75) Inventors: Chi-Chih Kuan, Nantou County (TW); Chun-Yu Chen, New Taipei (TW)

(73) Assignee: Silicon Motion Inc., Hsinchu County (TW)

( * ) Notice: Subject to any disclaimer, the term of this patent is extended or adjusted under 35 U.S.C. 154(b) by 329 days.

(21) Appl. No.: 13/213,052

(22) Filed: Aug. 18, 2011

(65) Prior Publication Data

US 2012/0173798 A1 Jul. 5, 2012

(30) Foreign Application Priority Data

Dec. 29, 2010 (TW) .............................. 099146580 A

(51) Int. Cl.
- *G06F 12/00* (2006.01)
- *G06F 11/30* (2006.01)
- *G11C 7/00* (2006.01)
- *G06F 11/00* (2006.01)

(52) U.S. Cl.
CPC .............. *G06F 11/3051* (2013.01); *G11C 7/00* (2013.01); *G06F 11/006* (2013.01)
USPC ...... 711/167; 711/103; 711/154; 365/185.33; 365/233.1; 713/2

(58) Field of Classification Search
USPC ........................................................ 711/167
See application file for complete search history.

(56) References Cited

U.S. PATENT DOCUMENTS

| 6,347,367 B1 * | 2/2002 | Dell et al. ...................... 711/170 |
| 6,530,001 B1 * | 3/2003 | Lee ................................ 711/154 |
| 2002/0060948 A1 * | 5/2002 | Chang et al. .................. 365/233 |
| 2002/0144173 A1 * | 10/2002 | Jeddeloh ....................... 713/501 |
| 2008/0162790 A1 * | 7/2008 | Im ................................. 711/103 |

FOREIGN PATENT DOCUMENTS

TW 200828021 7/2008

OTHER PUBLICATIONS

Nathan Eddy; "Toshiba Offers Double Data Rate Toggle Mode NAND"; posted on Aug. 13, 2010; retrieved from http://www.eweek.com/c/a/Data-Storage/Toshiba-Offers-Double-Data-Rate-Toggle-Mode-NAND-296651/ on Sep. 3, 2013.*
Doug Wong; "Understanding and selecting higher performance NAND architectures"; posted on Dec. 9, 2010; retrieved from http://www.eetimes.com/document.asp?doc_id=1278459&print=y on Sep. 3, 2013.*
Doug Wong; "Flash Technology: 200-400Mbps and Beyond"; Presented on Sep. 29, 2010; Retrieved on Sep. 3, 2013.*
Ha Ryong Yoon; "Toggle-Mode NAND to Fill Growing Need for Higher Performance"; Presented Aug. 2009; Retrieved on Sep. 3, 2013.*

* cited by examiner

*Primary Examiner* — Aimee Li
*Assistant Examiner* — Prasith Thammavong
(74) *Attorney, Agent, or Firm* — Winston Hsu; Scott Margo

(57) ABSTRACT

A memory controller includes a clock detector and a microprocessor. The clock detector is utilized for detecting if a specific pin of the memory controller has a clock signal thereon to generate a detecting result. The microprocessor is coupled to the clock generator, and is utilized for determining which type of memory devices that the memory controller is applied to according to the detecting result.

16 Claims, 5 Drawing Sheets

MEMORY CONTROLLER, MEMORY DEVICE AND METHOD FOR DETERMINING TYPE OF MEMORY DEVICE

BACKGROUND OF THE INVENTION

1. Field of the Invention

The present invention relates to a memory device, and more particularly, to a flash memory controller, a flash memory device and a method for determining a type of a memory device.

2. Description of the Prior Art

The flash memory devices can be classified into two types, double data rate NAND-type (DDR NAND-type) flash memory device and single data rate NAND-type (SDR NAND-type) flash memory device. A flash memory controller, built in the flash memory device, will detect a type of the flash memory device automatically when the flash memory controller starts up, and then the flash memory controller can be correctly operated.

The conventional flash memory controller determines the type of the flash memory device by reading a content of a specific bit stored in a flash memory chip. However, because an error may have occurred when the flash memory controller reads the content of the specific bit, and an address of the specific bit may be varied when flash memory controllers are provided by different manufacturers, the flash memory controller may erroneously determine the type of the flash memory device when a single bit is used in this determination step, which influences the operations of the flash memory device.

SUMMARY OF THE INVENTION

It is therefore an objective of the present invention to provide a memory controller, a memory device and a method for determining a type of a memory device, which can correctly determine the type of the memory device, to solve the above-mentioned problems.

According to one embodiment of the present invention, a memory controller comprises a clock detector and a microprocessor. The clock detector is utilized for detecting if a specific pin of the memory controller has a clock signal thereon to generate a detecting result. The microprocessor is coupled to the clock generator, and is utilized for determining which type of memory devices that the memory controller is applied to according to the detecting result.

According to another embodiment of the present invention, a method for determining a type of a memory device comprises: detecting if a specific pin of a memory controller placed in the memory device has a clock signal thereon to generate a detecting result; and determining the type of the memory device according to the detecting result.

According to another embodiment of the present invention, a memory device comprises at least a memory chip and a memory controller coupled to the memory chip, where the memory controller comprises a clock detector and a microprocessor. The clock detector is utilized for detecting if a specific pin of the memory controller has a clock signal thereon to generate a detecting result. The microprocessor is coupled to the clock generator, and is utilized for determining which type of memory devices that the memory controller is applied to according to the detecting result.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
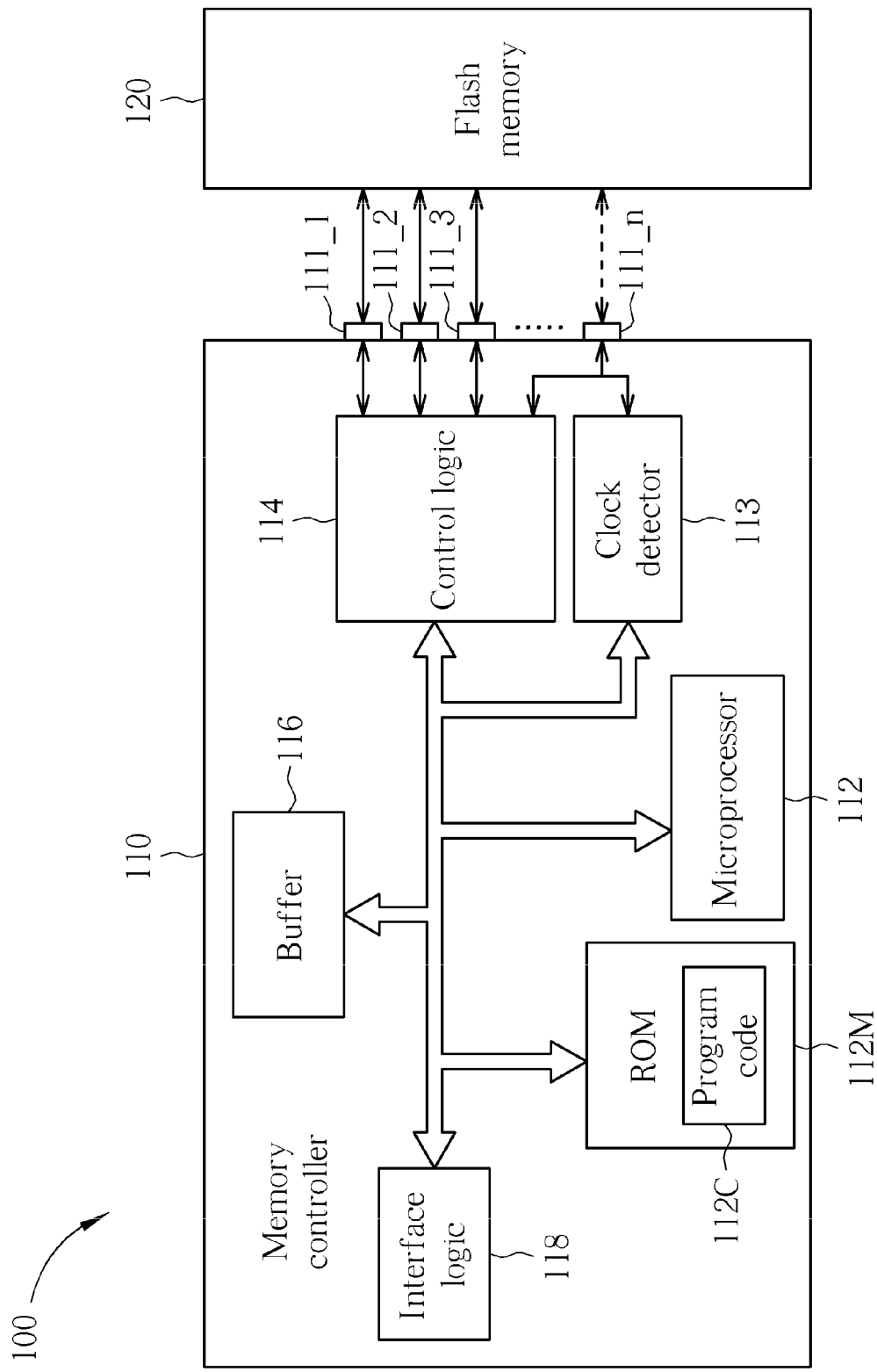
FIG. 1A is a diagram illustrating a memory device according to one embodiment of the present invention.

Please refer to FIG. 1A. FIG. 1A is a diagram illustrating a memory device 100 according to one embodiment of the present invention. The memory device 100 of this embodiment can be a portable memory device, such as a memory card complying with SD/MMC, CF, MS, or XD standards. The memory device 100 comprises a flash memory 120, and further comprises a controller arranged to access the flash memory 120, where the aforementioned controller of this embodiment is a memory controller 110. According to this embodiment, the memory controller 110 comprises a plurality of pins 111_1-111_n, a microprocessor 112, a read only memory (ROM) 112M, a clock detector 113, a control logic 114, a buffer memory 116, and an interface logic 118. The ROM 112M is arranged to store a program code 112C, and the microprocessor 112 is arranged to execute the program code 112C to control access to the flash memory 120. In addition, in this embodiment, the pin 111_n is arranged to receiver/transmit a clock signal DQS (SQ Strobe), and one of the pin 111_1-111_(n-1) is arranged to receiver/transmit another clock signal WE (Write Enable).

Typically, the flash memory 120 comprises a plurality of blocks, and the controller (e.g. the memory controller 110 that executes the program code 112C by utilizing the microprocessor 112) performs data copying, erasure and combining operations on the flash memory 120 by copying, erasing and combining in units of blocks. In addition, a block can be utilized for recording a specific amount of pages, where the controller (e.g. the memory controller 110 that executes the program code 112C by utilizing the microprocessor 112) performs data writing operations on the flash memory 120 by writing/programming in units of pages.

In practice, the memory controller 110 that executes the program code 112C by utilizing the microprocessor 112 is capable of performing various control operations by utilizing the internal components within the memory controller 110. For example, the memory controller 110 utilizes the control logic 114 to control access to the flash memory 120 (e.g. operations of accessing at least one block or at least one page), utilizes the buffer memory 116 to perform buffering operations for the memory controller 110, and utilizes the interface logic 118 to communicate with a host device.

In addition, when the memory device 100 is a DDR NAND-type flash memory device, the pin 111_n is electrically connected to the flash memory 120, and the memory controller 110 uses the clock signal DQS to transmit data to the flash memory 120 (especially from the host device to the flash memory 120) or to read data from the flash memory 120

(especially the data read by the host device). When the memory controller 110 intends to store data into the flash memory 120, the memory controller 110 transmits the clock signal DQS to the flash memory 120; and when the memory controller 110 intends to read data from the flash memory 120, the memory controller 110 receives the clock signal DQS from the flash memory 120. Furthermore, the memory controller 110 uses the clock signal WE to transmit commands or addresses to the flash memory 120. In addition, when the memory controller 110 intends to read data from the flash memory 120, first, the microprocessor 112 transmits a read command to the flash memory 120, and after the microprocessor 112 transmits the read command to the flash memory 120, the flash memory 120 will transmit the clock signal DQS and the data synchronously to the memory controller 110. On the other hand, when the memory device 100 is a SDR NAND-type flash memory device, the pin 111_$n$ is not electrically connected to the flash memory 120 (i.e., the pin 111_$n$ is floating).

Figure 1B:
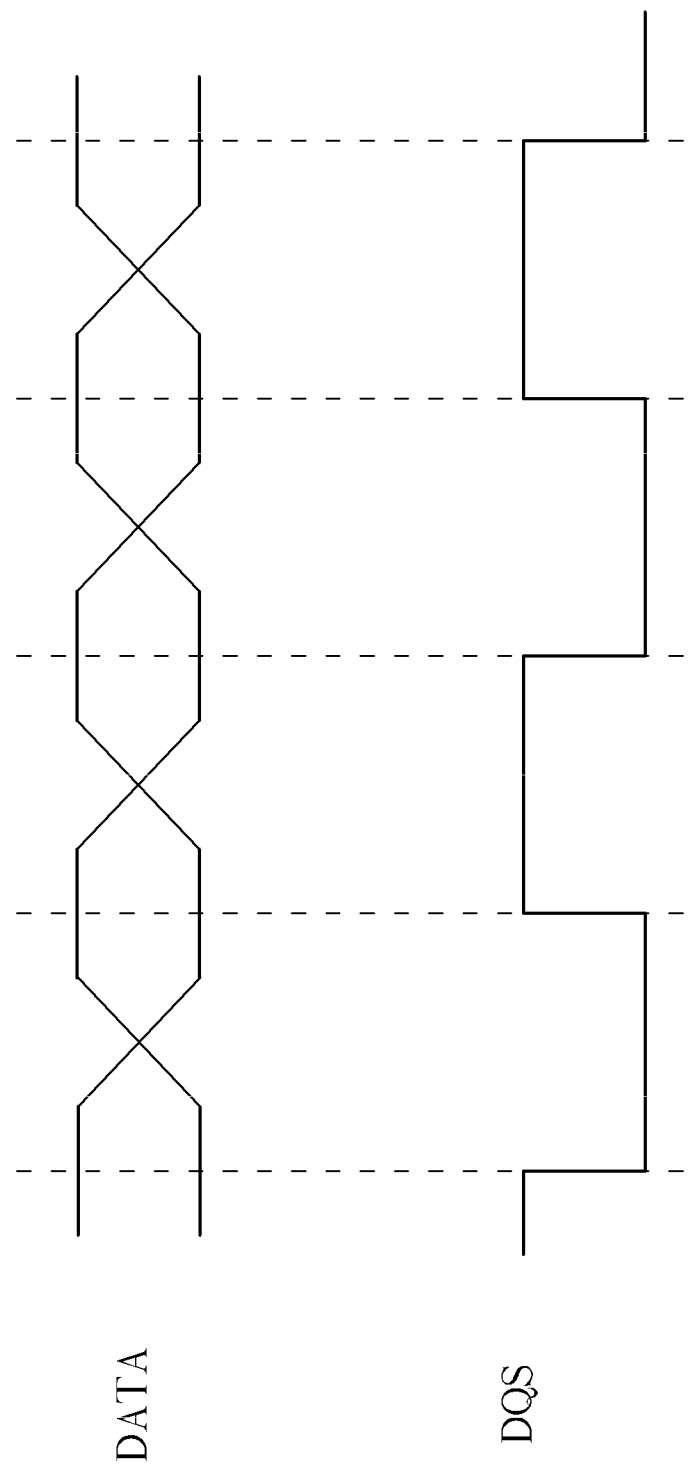
FIG. 1B shows a DDR NAND-type flash memory device using a clock signal DQS to sample data.

In addition, please refer to FIG. 1B. FIG. 1B shows a DDR NAND-type flash memory device using the clock signal DQS to sample the data. As shown in FIG. 1B, the clock signal DQS is used to sample the data DATA, and both the rising edge and the falling edge of the clock signal DQS are used to sample the data DATA which is transmitted from the flash memory 120 to the memory controller 110 via at least the pins 111_1-111_3. Please note that, when the memory controller 110 intends to transmits the commands or the addresses to the flash memory 120, the memory controller 110 only uses the rising edge of the clock signal WE to sample the commands or the addresses.

Therefore, because the DDR NAND-type flash memory device has the clock signal DQS and the SDR NAND-type flash memory device does not have the clock signal DQS, an embodiment of the present invention provides a method to determine a type of the memory device 100 by detecting if a specific pin (i.e., the pin 111_$n$) of the memory controller 110 has a clock signal (i.e., the clock signal DQS). Particularly, the type of the memory device 100 is determined by detecting if the specific pin receives the clock signal DQS from the flash memory 120.

Figure 2:
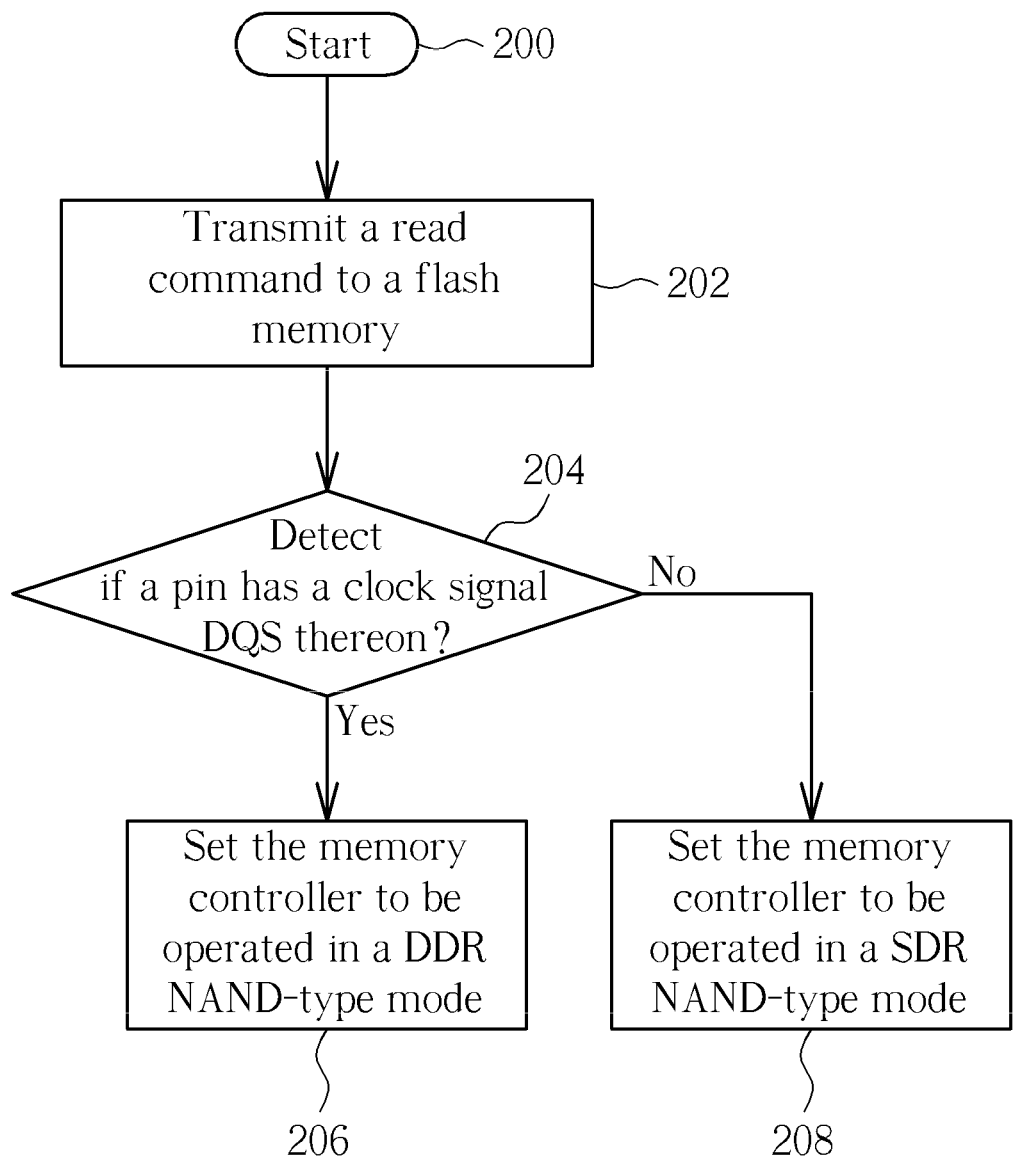
FIG. 2 is a flowchart of a method of determining a type of the memory device according to one embodiment of the present invention.

Please refer to FIG. 1A and FIG. 2 together. FIG. 2 is a flowchart of a method of determining a type of the memory device 100 according to one embodiment of the present invention. Referring to FIG. 2, the flow is described as follows.

In Step 200, the flow is started, and the memory device 100 starts up. Then, in Step 202, the microprocessor 112 transmits a read command to the flash memory 120 to ask for data stored in the flash memory 120. Then, in Step 204, after the microprocessor 112 transmits the read command to the flash memory 120, the clock detector 113 detects if the pin 111_$n$ has the clock signal DQS thereon. If the pin 111_$n$ has the clock signal DQS thereon, the flow enters Step 206 to set the memory controller 110 to be operated at a DDR NAND-type mode; and if the pin 111_$n$ does not have the clock signal DQS thereon, the flow enters Step 208 to set the memory controller 110 to be operated at a SDR NAND-type mode. When the memory controller 110 is set to be operated at the DDR NAND-type mode, the memory controller 110 will notice the related circuit (i.e., the control logic 114) to use the clock signal DQS to sample the data DATA, that is using the rising edge and the falling edge of the clock signal DQS to sample the data DATA.

In addition, please refer to FIG. 1B. because a voltage level of the clock signal DQS is varied between logic values "1" and "0", therefore, in Step 204, it can determine if the pin 111_$n$ has the clock signal DQS thereon by detecting if the voltage level at the pin 111_$n$ is toggled. That is, if the voltage level at the pin 111_$n$ is not toggled, it is represented that the pin 111_$n$ does not have the clock signal DQS thereon; on the contrary, if the voltage level at the pin 111_$n$ is toggled, it is represented that the pin 111_$n$ has the clock signal DQS thereon. Particularly, in order to prevent from an irregular interference on the pin 111_$n$, it can determine if the pin 111_$n$ has the clock signal DQS thereon after detecting toggles at the pin 111_$n$ a plurality of times.

Figure 3:
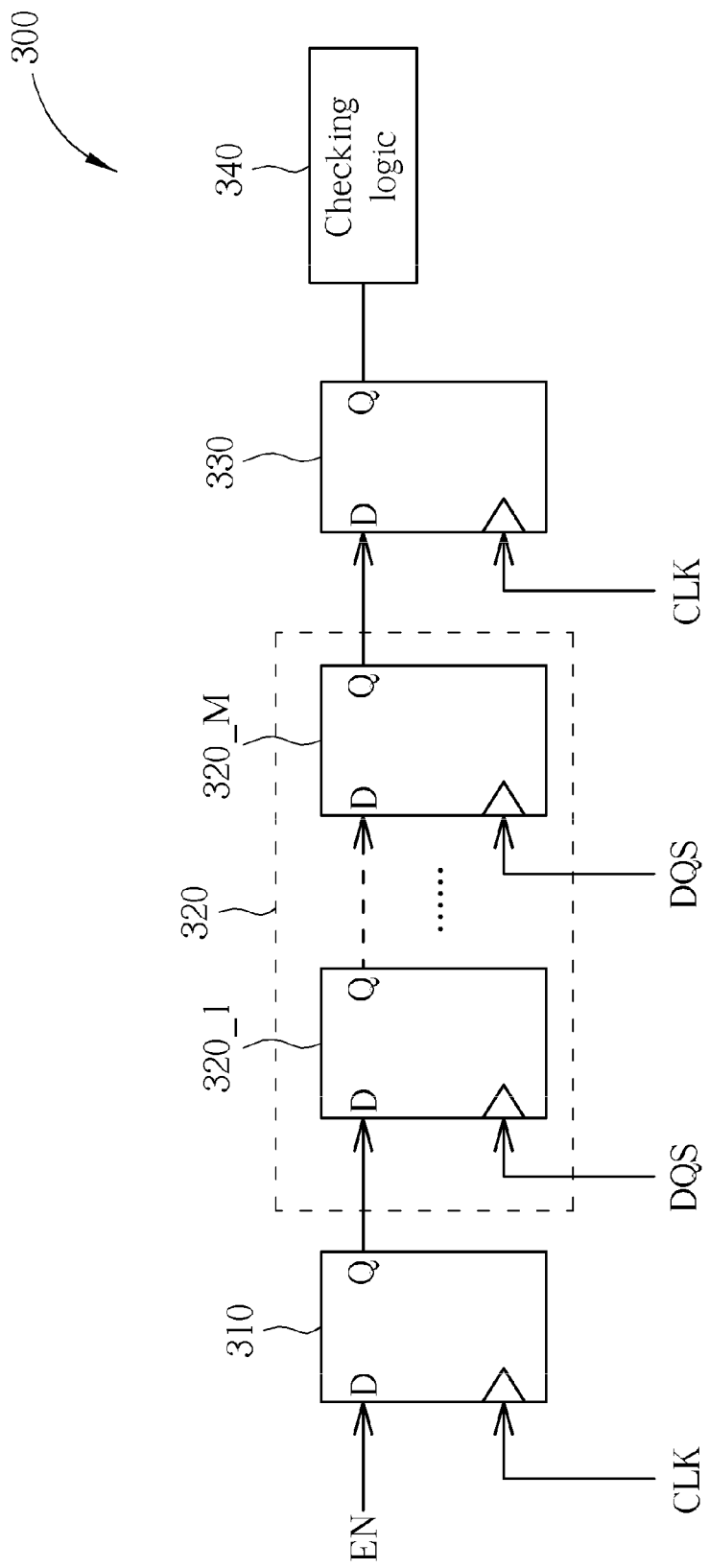
FIG. 3 is a diagram illustrating the clock detector according to one embodiment of the present invention.

Please refer to FIG. 3. FIG. 3 is a diagram illustrating the clock detector 300 according to one embodiment of the present invention. As shown in FIG. 3, the clock generator 300 includes a control unit (in this embodiment, a flip-flops 310 serves as the control unit), a flip-flop group 320 including a plurality of flip-flops 320_1-320_M, a flip-flop 330 and a checking logic 340, where clock receiving terminals of the flip-flops 310 and 330 are coupled to a system clock CLK, clock receiving terminals of the flip-flops 320_1-320_M are coupled to the pin 111_$n$, and an output terminal of the flip-flop 330 has a predetermined logic value "0". The flip-flops shown in FIG. 3 are D-type flip-flops, but it is not a limitation of the present invention. In the operations of the clock detector 300, first, after the memory device 100 starts up, the microprocessor 112 sends an enable signal EN (i.e., logic "1") to an input node D of the flip-flop 310. Then, the flip-flop 310 sends the enable signal EN to the flip-flop 320_1. Then, if the memory device 100 is a DDR NAND-type flash memory device, the enable signal EN will be transmitted to the checking logic 340 because the flip-flops 320_1-320_M and 330 can be triggered by the clock signal DQS from the pin 111_$n$, and the checking logic 340 can receive the enable signal EN having logic "1". On the contrary, if the memory device 100 is a SDR NAND-type flash memory device, the flip-flop group 320 cannot transmit the enable signal EN to the checking logic 340 because the flip-flop 320_1 is not triggered by the clock signal DQS, and the checking logic 340 receives the predetermined logic "0". In light of above, the checking logic 340 can determine the type of the memory device 100 by determining the voltage level at the output terminal of the flip-flop 330.

It is noted that, because the voltage level at the pin 111_$n$ may be varied due to noises, a plurality of flip-flops 320_1-320_M are arranged in the flip-flop group 320 to prevent from erroneously determining a SDR NAND-type flash memory device to be a DDR NAND-type flash memory device. In other words, the enable signal EN is transmitted to the checking logic 340 only if the voltage level of the clock signal DQS varies between logics "0" and "1" many times. Therefore, the erroneous determination can be avoided. It is noted that, the clock detector 300 shown in FIG. 3 is for illustrative purposes only, in other embodiments of the present invention, the flip-flop group 320 can include only one flip-flop. This alternative design should fall within the scope of the present invention.

Figure 4:
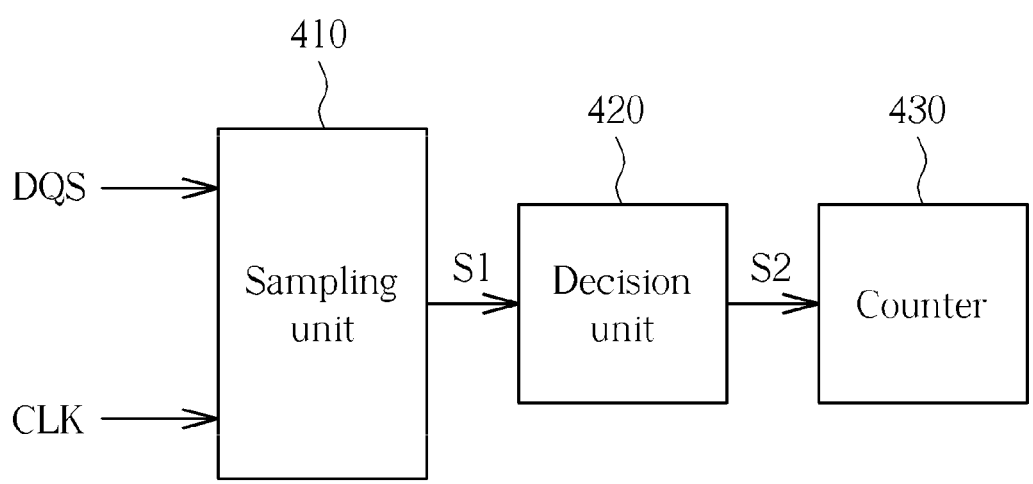
FIG. 4 is a diagram illustrating the clock detector according to another embodiment of the present invention.

Please refer to FIG. 4. FIG. 4 is a diagram illustrating the clock detector 400 according to another embodiment of the present invention. As shown in FIG. 4, the clock detector 400 comprises a sampling unit 420, a decision unit 420 and a counter 430. In the operations of the clock detector 400, the sampling unit 410 uses a system clock CLK to sample the clock signal DQS from the pin 111_$n$ to generate a sample signal S1, where a frequency of the system clock CLK is greater than a frequency of the clock signal DQS. Then, the decision unit 420 determines if a state of the sampled signal S1 is varied (e.g., from logic "0" to logic "1"). If it is determined that the state of the sampled signal S1 is varied, the decision unit 420 generates an enable signal S2 to the counter 430 to increase a counting value counted by the counter 430; and if it is determined that the state of the sampled signal S1 is not varied, the decision unit 420 does not generate the enable signal S2 to the counter 430 (i.e., the counting value is not changed). Therefore, the type of the memory device 100 can be determined by using the counting value counted by the counter 430. For example, if the counting value is greater than a threshold value, it is determined that the memory device 100 is a DDR NAND-type flash memory device; and if the counting value is not greater than a threshold value, it is determined that the memory device 100 is a SDR NAND-type flash memory device.

Briefly summarized, in the memory controller, memory device and method for determining the type of the memory device of the present invention, the type of the memory device is determined by detecting if a specific pin of the memory controller has a clock signal thereon. Therefore, compared with the prior art flash memory device, the present invention can determine the type of the memory device more accurately to prevent from influencing the operations of the memory device.

Those skilled in the art will readily observe that numerous modifications and alterations of the device and method may be made while retaining the teachings of the invention.

What is claimed is:

1. A memory controller, comprising:
   a clock detector, for detecting if a specific pin of the memory controller has a first clock signal thereon and detecting whether the specific pin does not have any clock signal thereon to generate a detecting result, wherein the detecting result indicates whether the specific pin does not have any clock signal thereon; and
   a microprocessor, coupled to the clock detector, for determining which type of memory devices that the memory controller is applied to according to the detecting result;
   wherein the clock detector comprises:
      a control unit, wherein when the memory controller starts up, the control unit outputs a state signal;
      at least one flip-flop, having a data input terminal coupled to the control unit, a clock receiving terminal coupled to the specific pin, and a data output terminal; and
      a checking logic, coupled to the data output terminal of the at least one flip-flop, and generating the detecting result according to a state at the data output terminal of the at least one flip-flop.

2. The memory controller of claim 1, wherein when the memory controller starts up, the microprocessor transmits a read command to a memory; and after the microprocessor transmits the read command to the memory, the clock detector detects if the specific pin of the memory controller has the first clock signal thereon, where the first clock signal is outputted from the memory in response to the read command.

3. The memory controller of claim 1, wherein when the detecting result represents that the specific pin has the first clock signal thereon, the microprocessor determines that the memory controller is applied to a double data rate NAND-type (DDR NAND-type) flash memory device.

4. The memory controller of claim 1, wherein when the detecting result represents that the specific pin does not have the first clock signal thereon, the microprocessor determines that the memory controller is applied to a single data rate NAND-type (SDR NAND-type) flash memory device.

5. The memory controller of claim 1, wherein the clock detector generates the detecting result after detecting if the specific pin has the first clock signal a plurality of times.

6. The memory controller of claim 5, wherein when the detecting result represents that a number of times that the specific pin is detected to have the first clock signal thereon is greater than a threshold value, the microprocessor determines that the memory controller is applied to a double data rate NAND-type (DDR NAND-type) flash memory device.

7. The memory controller of claim 5, wherein when the detecting result represents that a number of times that the specific pin is detected to have the first clock signal thereon is not greater than a threshold value, the microprocessor determines that the memory controller is applied to a single data rate NAND-type (SDR NAND-type) flash memory device.

8. A memory controller, comprising:
   a clock detector, for detecting if a specific pin of the memory controller has a first clock signal thereon and detecting whether the specific pin does not have any clock signal thereon to generate a detecting result, wherein the detecting result indicates whether the specific pin does not have any clock signal thereon; and
   a microprocessor, coupled to the clock detector, for determining which type of memory devices that the memory controller is applied to according to the detecting result;
   wherein the clock detector generates the detecting result after detecting if the specific pin has the first clock signal a plurality of times, and the clock detector comprises:
      a sampling unit, for utilizing a second clock signal to sample a voltage level at the specific pin to generate a sampled signal; and
      a counter, coupled to the sampling unit, for accumulating a number of times that the voltage level at the specific pin is varied to generate the detecting result according to the sampled signal.

9. A method for determining a type of a memory device, comprising:
   detecting if a specific pin of a memory controller of the memory device has a first clock signal thereon and detecting whether the specific pin does not have any clock signal thereon to generate a detecting result, wherein the detecting result indicates whether the specific pin does not have any clock signal thereon; and
   determining the type of the memory device according to the detecting result;
   wherein the step of generating the detecting result comprises:
      when the memory controller starts up, outputting a state signal;
      providing at least one flip-flop having a data input terminal coupled to the control unit, a clock receiving terminal coupled to the specific pin, and a data output terminal; and
      generating the detecting result according to a state at the data output terminal of the at least one flip-flop.

10. The method of claim 9, further comprising:
    when the memory controller starts up, transmitting a read command to a memory; and
    the step of generating the detecting result comprises:
       after transmitting the read command to the memory, detecting if the specific pin of the memory controller has the first clock signal thereon, where the first clock signal is outputted from the memory in response to the read command.

11. The method of claim 9, wherein the step of determining the type of the memory device according to the detecting result comprises:
    when the detecting result represents that the specific pin has the first clock signal thereon, determining that the memory controller is applied to a double data rate NAND-type (DDR NAND-type) flash memory device.

12. The method of claim 9, wherein the step of determining the type of the memory device according to the detecting result comprises:
   when the detecting result represents that the specific pin does not have the first clock signal thereon, determining that the memory controller is applied to a single data rate NAND-type (SDR NAND-type) flash memory device.

13. The method of claim 9, wherein the step of generating the detecting result comprises:
   generating the detecting result after detecting if the specific pin has the first clock signal a plurality of times.

14. The method of claim 13, wherein the step of determining the type of the memory device according to the detecting result comprises:
   when the detecting result represents that a number of times that the specific pin is detected to have the first clock signal thereon is greater than a threshold value, determining that the memory controller is applied to a double data rate NAND-type (DDR NAND-type) flash memory device.

15. The method of claim 13, wherein the step of determining the type of the memory device according to the detecting result comprises:
   when the detecting result represents that a number of times that the specific pin is detected to have the first clock signal thereon is not greater than a threshold value, determining that the memory controller is applied to a single data rate NAND-type (SDR NAND-type) flash memory device.

16. A method for determining a type of a memory device, comprising:
   detecting if a specific pin of a memory controller of the memory device has a first clock signal thereon and detecting whether the specific pin does not have any clock signal thereon to generate a detecting result, wherein the detecting result indicates whether the specific pin does not have any clock signal thereon; and
   determining the type of the memory device according to the detecting result;
   wherein the step of generating the detecting result comprises:
   generating the detecting result after detecting if the specific pin has the first clock signal a plurality of times;
   utilizing a second clock signal to sample a voltage level at the specific pin to generate a sampled signal; and
   accumulating a number of times that the voltage level at the specific pin is varied to generate the detecting result according to the sampled signal.

* * * * *